(12) United States Patent
Wu et al.

(10) Patent No.: US 12,041,764 B2
(45) Date of Patent: Jul. 16, 2024

(54) METHOD FOR MANUFACTURING BURIED WORD LINE TRANSISTOR, TRANSISTOR AND MEMORY

(71) Applicant: CHANGXIN MEMORY TECHNOLOGIES, INC., Hefei (CN)

(72) Inventors: Gongyi Wu, Hefei (CN); Nan Deng, Hefei (CN); Yuchen Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/449,502

(22) Filed: Sep. 30, 2021

(65) Prior Publication Data

US 2022/0085031 A1 Mar. 17, 2022

Related U.S. Application Data

(63) Continuation of application No. PCT/CN2021/104813, filed on Jul. 6, 2021.

(30) Foreign Application Priority Data

Sep. 16, 2020 (CN) .......................... 202010974520.8

(51) Int. Cl.
H10B 12/00 (2023.01)
(52) U.S. Cl.
CPC ........... *H10B 12/053* (2023.02); *H10B 12/34* (2023.02)
(58) Field of Classification Search
CPC ............................ H10B 12/488; H01L 21/764
See application file for complete search history.

(56) References Cited

U.S. PATENT DOCUMENTS

| | | | |
|---|---|---|---|
| 7,612,406 B2 | 11/2009 | Kluge | |
| 9,224,619 B2 | 12/2015 | Yi et al. | |
| 9,972,626 B1 | 5/2018 | Takesako et al. | |
| 10,134,740 B2 | 11/2018 | Kim et al. | |
| 2008/0061322 A1 | 3/2008 | Von Kluge | |
| 2015/0221742 A1 | 8/2015 | Yi et al. | |
| 2018/0145080 A1 | 5/2018 | Kim et al. | |
| 2021/0066466 A1* | 3/2021 | Kwon | ................. H01L 29/4966 |

FOREIGN PATENT DOCUMENTS

| | | |
|---|---|---|
| CN | 101140950 A | 3/2008 |
| CN | 101174648 A | 5/2008 |
| CN | 102543944 B | 6/2016 |
| CN | 108063140 A | 5/2018 |
| CN | 109192728 A | 1/2019 |

* cited by examiner

*Primary Examiner* — Hsien Ming Lee
(74) *Attorney, Agent, or Firm* — Syncoda LLC; Feng Ma

(57) ABSTRACT

A method for manufacturing a buried word line transistor can include the following operations. A semiconductor substrate having an active region is provided. A first trench is formed in the active region. A first insulation layer is formed on a side wall of the first trench. A bottom portion of the first trench is etched to form a second trench. A gate oxide layer is formed on a side wall of the first insulation layer and a bottom portion and a side wall of the second trench. A barrier layer is formed at a bottom portion and portion of a side wall of the gate oxide layer. A metal filler layer is formed on an inner side of the barrier layer. The first insulation layer is removed to form a side trench. A second insulation layer is formed at a top end of the side trench. A sealed air spacer layer is formed.

20 Claims, 15 Drawing Sheets

METHOD FOR MANUFACTURING BURIED WORD LINE TRANSISTOR, TRANSISTOR AND MEMORY

CROSS-REFERENCE TO RELATED APPLICATIONS

This is a continuation of International Application No. PCT/CN2021/104813 filed on Jul. 6, 2021, which claims priority to Chinse Patent Application No. 202010974520.8 filed on Sep. 16, 2020. The disclosures of these applications are hereby incorporated by reference in their entirety.

BACKGROUND

A Dynamic Random-Access Memory (DRAM) is a common semiconductor device in an electronic device such as a computer, and includes a memory cell array configured to store data and a peripheral circuit located on a periphery of the memory cell array. Each memory cell usually includes a transistor and a capacitor, and the transistor is controlled to be switched on and switched off through a word line, such that data information can be read from or written into the capacitor through a bit line.

SUMMARY

The present application relates to a semiconductor technology, and particularly relates to a method for manufacturing a buried word line transistor, a transistor and a memory.

The present application provides a method for manufacturing a buried word line transistor, a transistor and a memory.

In a first aspect, the present application provides a method for manufacturing a buried word line transistor, including:
  providing a semiconductor substrate having an active region, forming a first trench in the active region;
  forming a first insulation layer on a side wall of the first trench, and etching a bottom portion of the first trench to form a second trench;
  forming a gate oxide layer on a side wall of the first insulation layer and a bottom portion and a side wall of the second trench, forming a barrier layer at a bottom portion and portion of a side wall of the gate oxide layer, and forming a metal filler layer on an inner side of the barrier layer;
  removing the first insulation layer to form a side trench between the gate oxide layer and the side wall of the first trench; and
  forming a second insulation layer at a top end of the side trench and over the barrier layer and the metal filler layer, and therefore forming a sealed air spacer layer between the gate oxide layer and the side wall of the first trench, an upper surface of the second insulation layer and an upper surface of the substrate being located on the same horizontal plane.

In a second aspect, the present application provides a buried word line transistor, including:
  a semiconductor substrate including an active region;
  a word line trench located in the active region;
  gate oxide layer located at a bottom portion and a side wall of the word line trench, an air spacer layer being formed on an outer side wall of the gate oxide layer;
  a barrier layer covering a bottom portion and portion of a side wall of the gate oxide layer;
  a metal filler layer filling a bottom portion of the word line trench and partially covering a surface of the barrier layer; and
  a second insulation layer configured to seal the air spacer layer and fill a space over the barrier layer and the metal filler layer, an upper surface of the second insulation layer and an upper surface of the substrate being located on the same horizontal plane.

In a third aspect, the present application provides a memory including any buried word line transistor in the second aspect.

BRIEF DESCRIPTION OF THE DRAWINGS

In order to describe the embodiments of the present application or the technical solutions in the existing art more clearly, drawings required to be used in the embodiments or the illustration of the existing art will be briefly introduced below. Apparently, the drawings in the illustration below are some embodiments of the present application. Those ordinarily skilled in the art also can acquire other drawings according to the provided drawings without doing creative work.

REFERENCE SIGNS IN THE DRAWINGS

Figure 1:
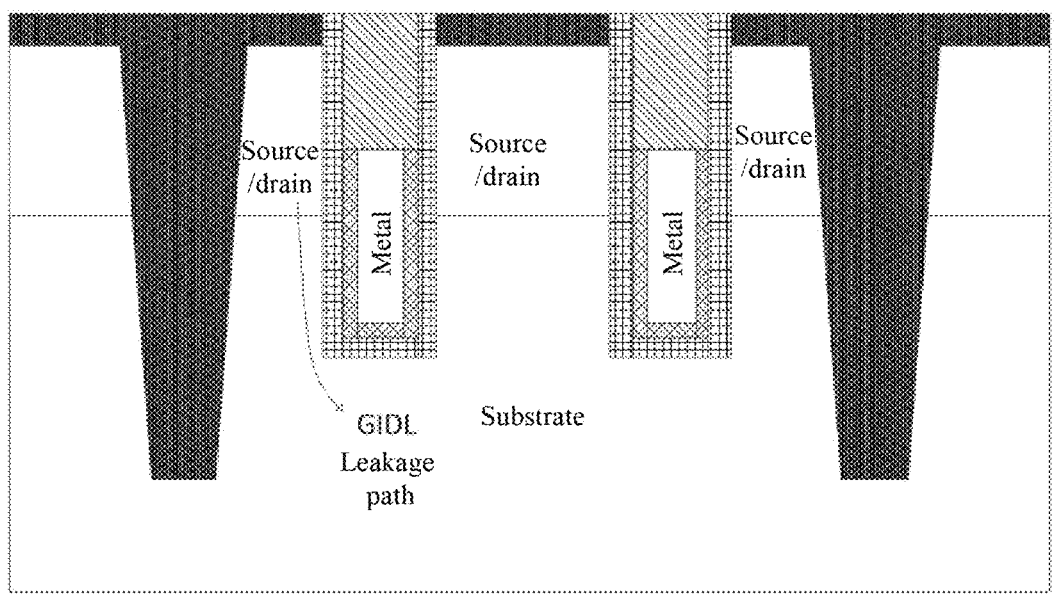
FIG. 1 is a schematic diagram of a structure and gate-induced drain leakage (GIDL) of a buried word line transistor.

100: semiconductor substrate
101: active region
102: shallow trench isolation structure
103: buried word line
104: isolation structure filler layer
105: first trench
106: first insulation material layer
107: first insulation layer
108: second trench
109: oxide material layer
110: barrier material layer
111: metal material layer
112: gate oxide layer
113: barrier layer
114: metal filler layer
115: side trench
116: second insulation material layer
117: air spacer layer
118: second insulation layer
119: word line trench

DETAILED DESCRIPTION

In order to make the objectives, technical solutions and advantages of the embodiments of the present application clearer, the technical solutions in the embodiments of the present application will be described clearly and completely below in combination with the drawings in the embodiments of the present application. Apparently, the embodiments described are part of the embodiments of the present application, not all the embodiments. Based on the embodiments in present application, all other embodiments obtained by those of ordinary skill in the art without creative work shall fall within the protection scope of the present application.

Due to the continuous development of manufacturing technology, a buried word line transistor has been developed in recent years. The size of the transistor becomes smaller and smaller, which makes the gate-induced drain leakage (GIDL) problem of the transistor more and more serious, resulting in a drift of transistor switching characteristic and a severe reduction in device performance and reliability.

FIG. 1 is a schematic diagram of a structure and gate-induced drain leakage (GIDL) of a buried word line transistor. As shown in FIG. 1, in an off state of the transistor, on an overlapping region of a buried word line (gate) metal and an interface between an N-type active region and a P-type substrate, a strong electric field between a gate and a source/drain region causes an increase in leakage current of a PN junction around a diffusion region of the source/drain region, i.e., forming GIDL.

Figure 2:
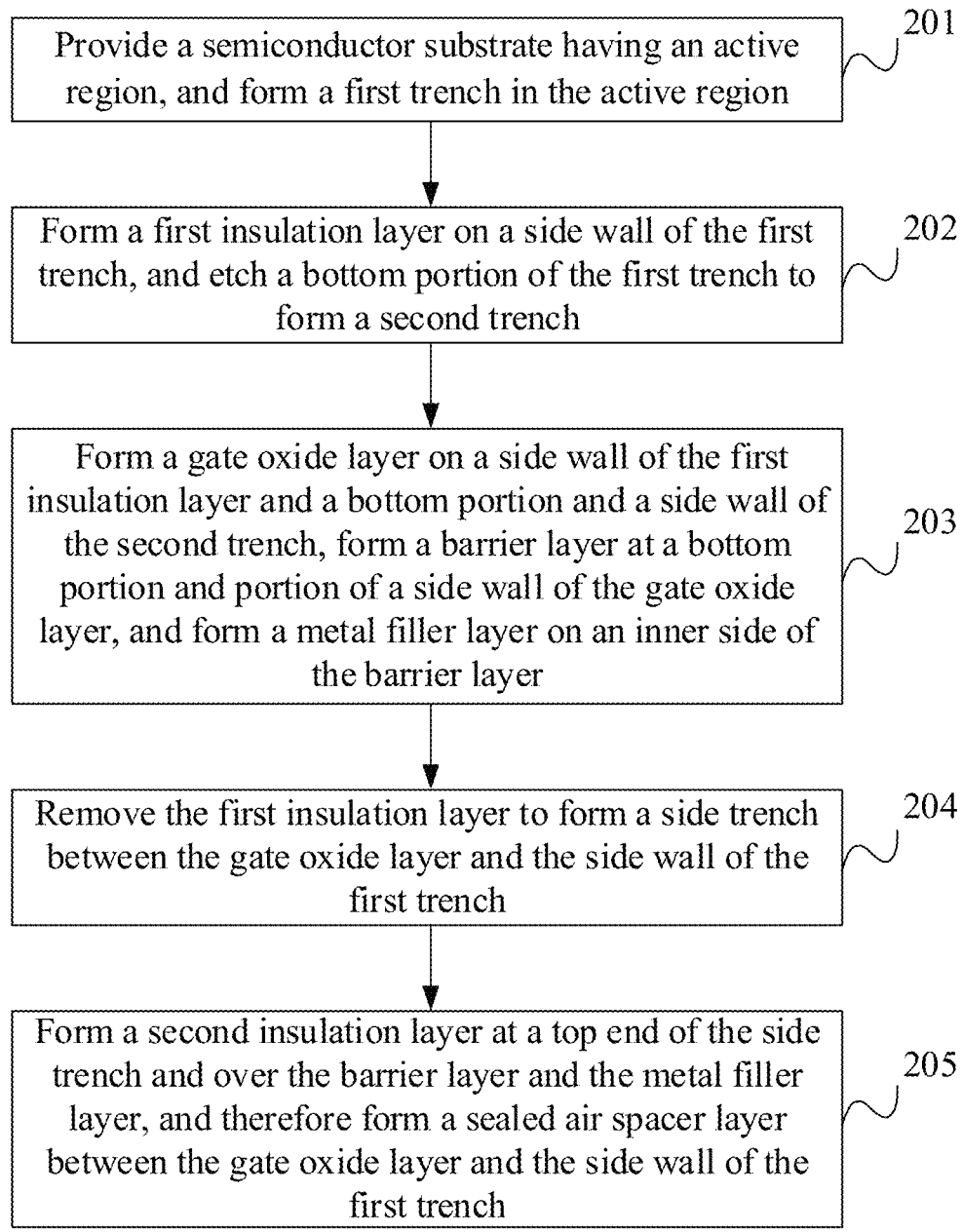
FIG. 2 is a flowchart of a method for manufacturing a buried word line transistor provided by the present application.
Figure 3:
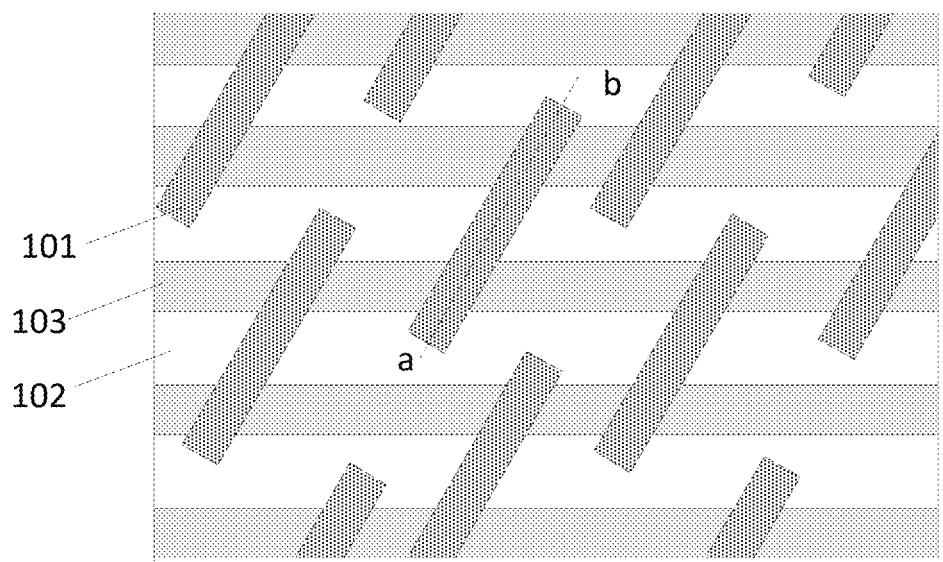
FIG. 3 is a schematic two-dimensional diagram of a structure of a buried word line transistor provided by the present application.

In order to improve the GIDL effect of the buried word line transistor, the present application provides a method for manufacturing a buried word line transistor. By means of forming an air spacer layer on a side wall of a buried word line, a voltage between the gate and the source/drain is reduced, the electric field strength of the PN junction is lowered, and the GIDL is reduced. The method for manufacturing a buried word line transistor provided by the present application is described below in combination with FIG. 2 to FIG. 15. FIG. 2 is a flowchart of a method for manufacturing a buried word line transistor provided by the present application. FIG. 3 is a schematic two-dimensional diagram of a structure of a buried word line transistor provided by the present application. FIG. 4 to FIG. 15 are schematic sectional diagrams of structures of the buried word line transistor shown in FIG. 3 along ab.

As shown in FIG. 2, the method includes the following steps.

At S201, a semiconductor substrate having an active region is provided, and a first trench is formed in the active region.

Figure 4:
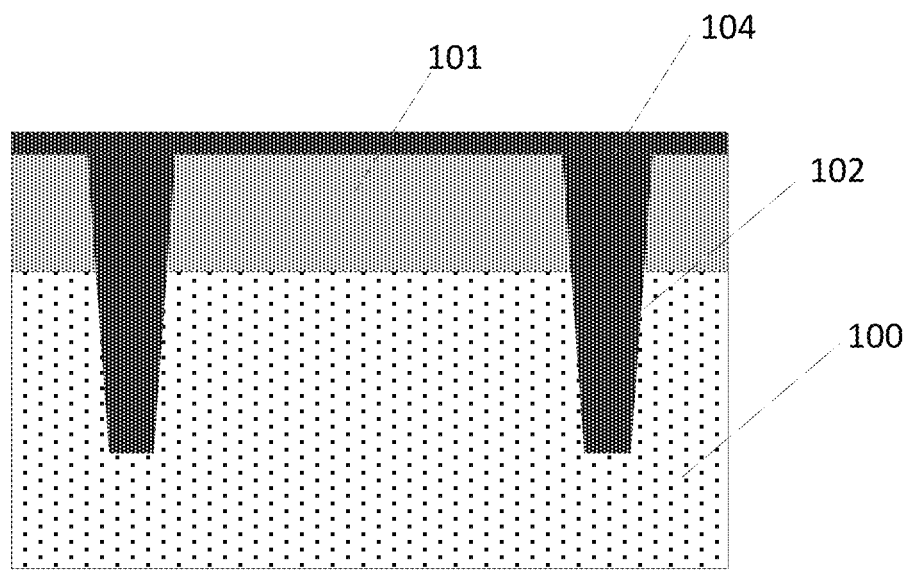
FIG. 4 is a schematic sectional diagram I of a structure of a buried word line transistor provided by the present application.

Referring to the two-dimensional diagram shown in FIG. 3 and the sectional diagram shown in FIG. 4, an active region 101 and a shallow trench isolation structure 102 are formed on the semiconductor substrate 100. The buried word line 103 is formed on the active region 101 and communicates with a plurality of active regions 101. It should be noted that the semiconductor substrate 100 covered by the active region 101 and the shallow trench isolation structure 102 is not shown in FIG. 3. The active region 101 is separated by the shallow trench isolation structure 102. An isolation structure filler layer 104 can also be formed over the active region 101 and the shallow trench isolation structure 102. The isolation structure filler layer 104 is used as a hard mask after being patterned to form the first trench. Materials of the shallow trench isolation structure 102 and the isolation structure filler layer 104 include, but are not limited to, silicon dioxide. The source/drain region is formed by performing ion implantation on the active region 101.

A material of the semiconductor substrate 100 includes, but is not limited to, a monocrystalline or polycrystalline semiconductor material, and can be an intrinsic monocrystalline silicon substrate or a lightly doped silicon substrate, or an N-type polycrystalline silicon substrate or a P-type polycrystalline silicon substrate. For example, the semiconductor substrate 100 is a P+ type polycrystalline silicon material substrate.

Figure 5:
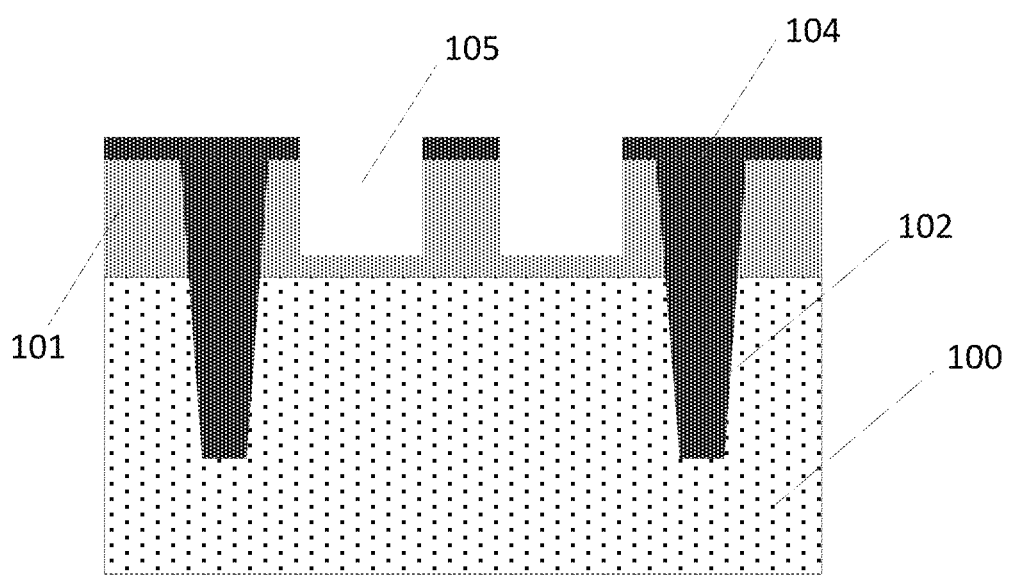
FIG. 5 is a schematic sectional diagram II of a structure of a buried word line transistor provided by the present application.

As shown in FIG. 5, the first trench 105 is formed in the active region 101. FIG. 5 is a schematic diagram of forming two first trenches 105 in the active region 101. The cross-sectional shape of each first trench 105 can be of any shape suitable for the device performance, such as a U shape or a rectangle. In FIG. 5, a rectangular cross section of the first trench 105 is taken as an example only. Optionally, a depth of the first trench 105 is 45 to 100 nm. The first trench 105 can be formed by using a patterning process.

At S202, a first insulation layer is formed on a side wall of the first trench, and a bottom portion of the first trench is etched to form a second trench.

Figure 6:
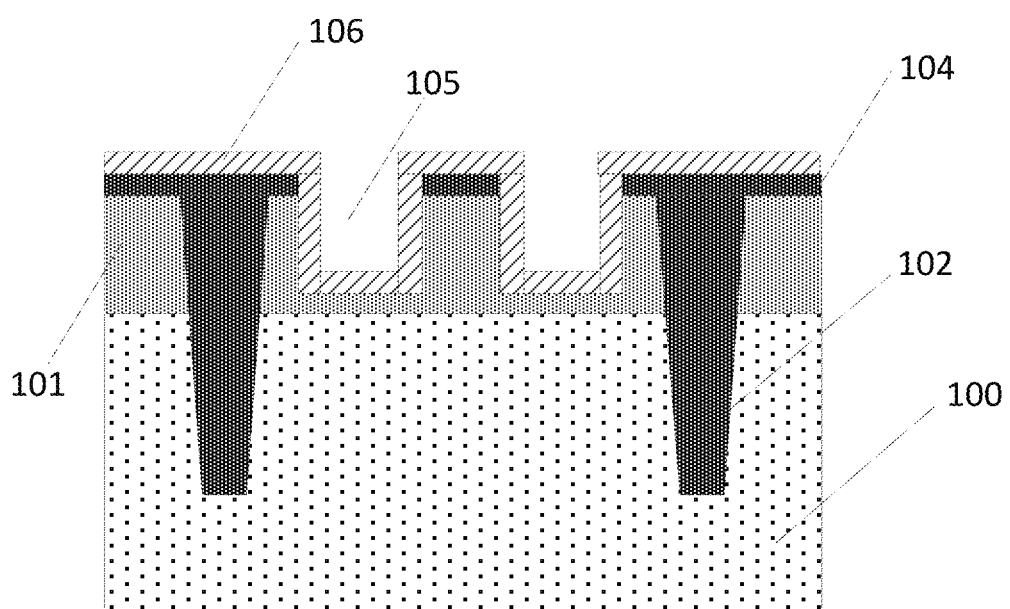
FIG. 6 is a schematic sectional diagram III of a structure of a buried word line transistor provided by the present application.

As an example, this step is described with reference to FIG. 6 to FIG. 8. As shown in FIG. 6, a first insulation material layer 106 is formed at a bottom portion and a side wall of the first trench 105 and an upper surface of the substrate 100 by using an atomic layer deposition process. The first insulation material layer 106 serves as a sacrificial layer and will be removed in a subsequent manufacturing process. Therefore, a material of the first insulation material layer 106 is different from the materials of the shallow trench isolation structure 102 and the isolation structure filler layer 104 to facilitate subsequent selective etching. Optionally, a material of the first insulation layer 107 is titanium nitride, and a thickness of the first insulation layer 107 is 3 to 10 nm.

Figure 7:
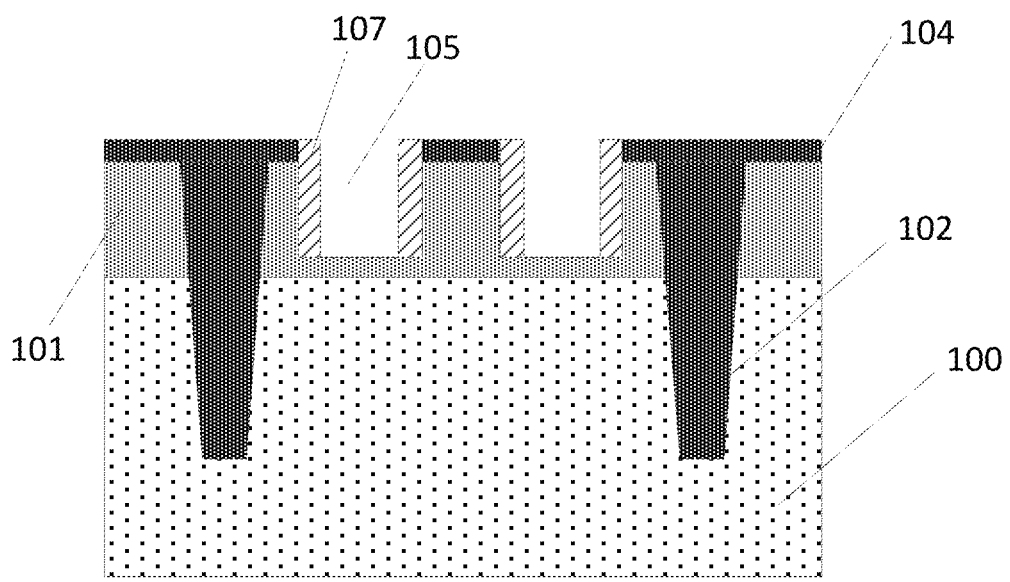
FIG. 7 is a schematic sectional diagram IV of a structure of a buried word line transistor provided by the present application.
Figure 8:
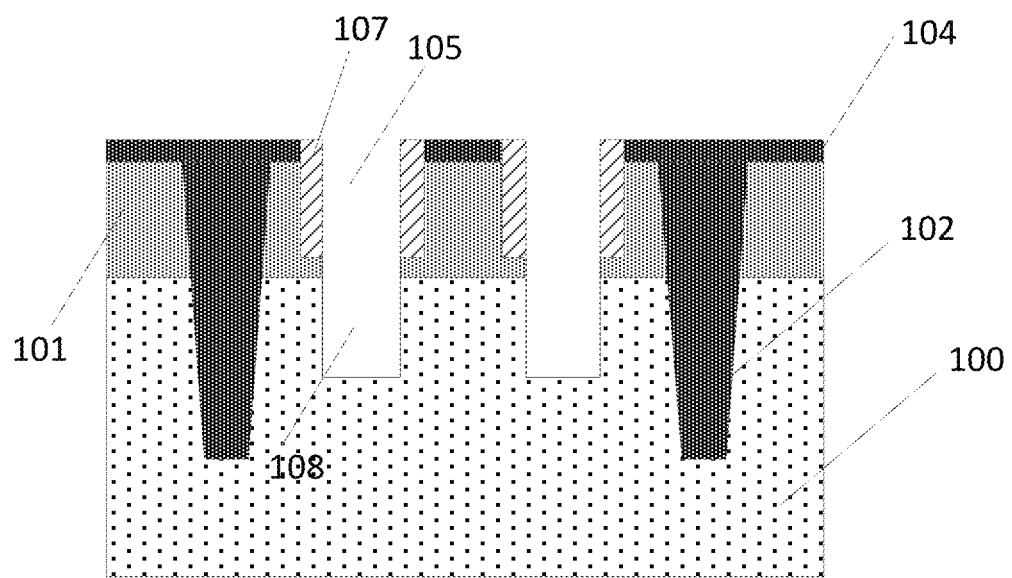
FIG. 8 is a schematic sectional diagram V of a structure of a buried word line transistor provided by the present application.

Further, as shown in FIG. 7, the first insulation material layer 106 on the upper surface of the substrate 100 and the first insulation material layer 106 at the bottom portion of the first trench 105 are etched to form the first insulation layer 107. As shown in FIG. 8, the substrate 100 exposed at the bottom portion of the first trench 105 is etched to form a second trench 108. A width of the second trench 108 is smaller than a width of the first trench 105. Optionally, a depth of the second trench 108 is 50 to 130 nm, and the width is 15 to 50 nm. The first trench 105 and the second trench 108 are jointly configured to form a word line trench where a buried word line 103 is located, and a total depth of the first trench 105 and the second trench 108 can be 120 to 200 nm.

At S203, a gate oxide layer is formed on a side wall of the first insulation layer and a bottom portion and a side wall of the second trench, a barrier layer is formed at a bottom portion and portion of a side wall of the gate oxide layer, and a metal filler layer is formed on an inner side of the barrier layer.

Figure 9:
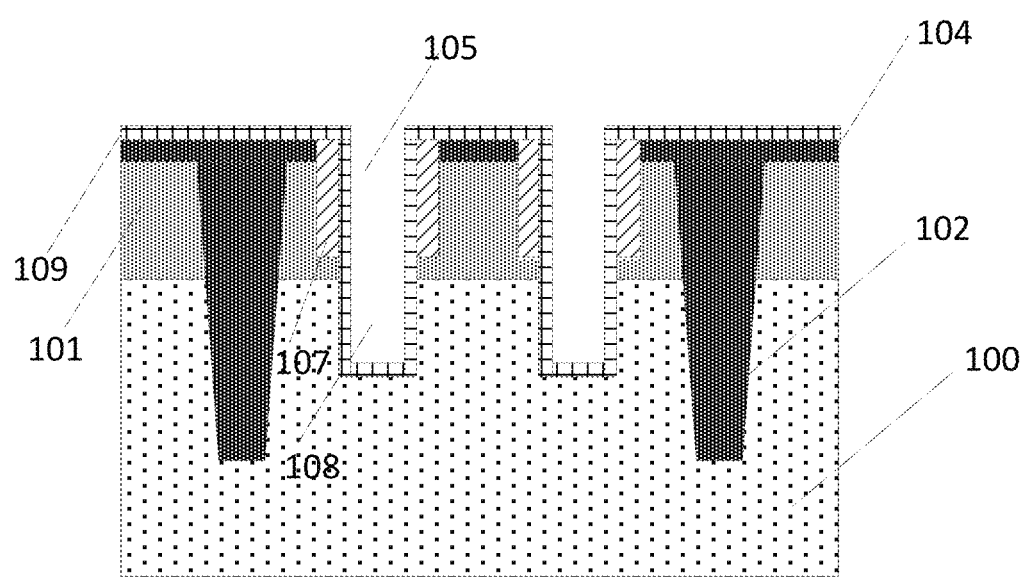
FIG. 9 is a schematic sectional diagram VI of a structure of a buried word line transistor provided by the present application.

As an example, this step is described with reference to FIG. 9 to FIG. 12. As shown in FIG. 9, an oxide material layer 109 is formed on a surface of the first insulation layer 107, the bottom portion and the side wall of the second trench 108 and an upper surface of the substrate 100 by using a thin film deposition process. Optionally, a material of the oxide material layer 109 can be silicon dioxide, silicon oxynitride, hafnium oxide, or the like, and a thickness of the oxide material layer 109 can be 2 to 10 nm.

Figure 10:
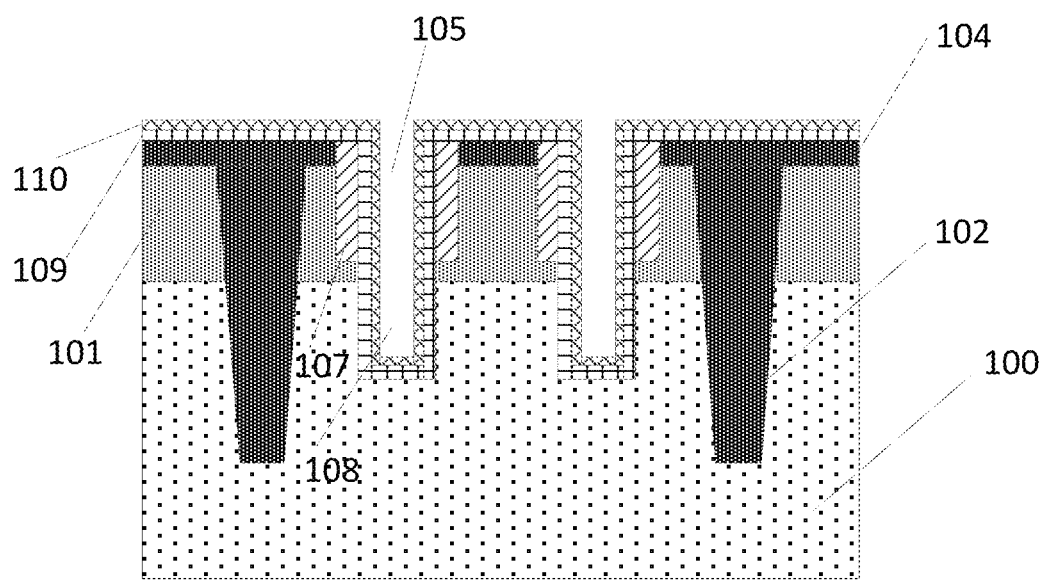
FIG. 10 is a schematic sectional diagram VII of a structure of a buried word line transistor provided by the present application.

Further, as shown in FIG. 10, a barrier material layer 110 is formed on a surface of the oxide material layer 109 by using the atomic layer deposition process. Optionally, a material of the barrier material layer 110 can be titanium nitride, and a thickness can be 2 to 7 nm.

Figure 11:
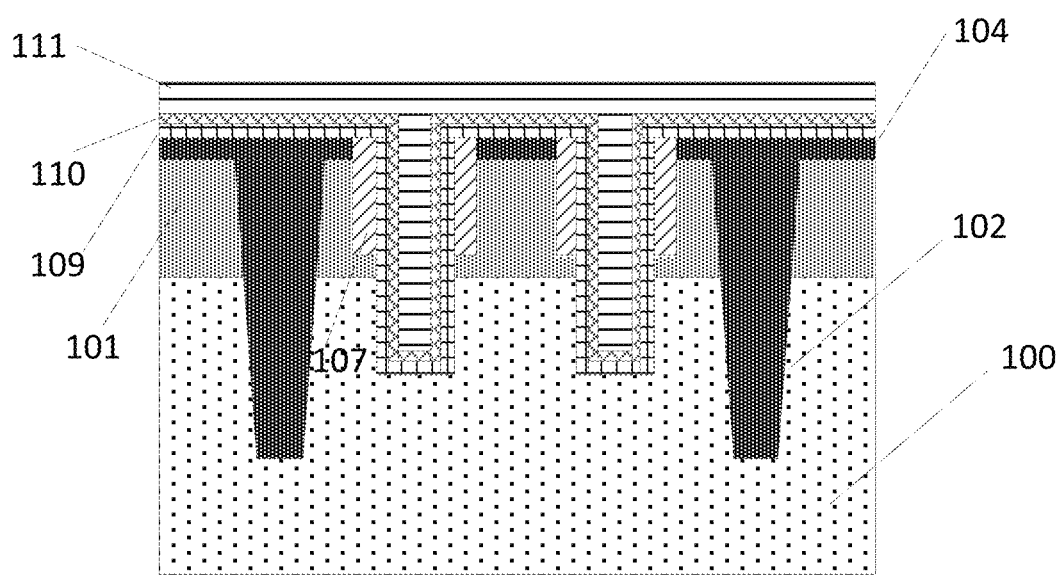
FIG. 11 is a schematic sectional diagram VIII of a structure of a buried word line transistor provided by the present application.

As shown in FIG. 11, a metal material layer 111 is formed on a surface of the barrier material layer 110 by using a chemical vapor deposition process. The metal material layer 111 fills the first trench 105 and the second trench 108 and covers the barrier material layer 110 on the upper surface of the substrate 100. Optionally, the metal of the metal material layer 111 can be tungsten. The barrier material layer 110 is configured to prevent metal diffusion of the metal material layer 111, so as to avoid a device failure caused by problems such as leakage and short circuit due to the metal diffusion. After the metal material layer 111 is formed by using the chemical vapor deposition process, a chemical mechanical planarization method can be employed to planarize the surface of the metal material layer 111.

Figure 12:
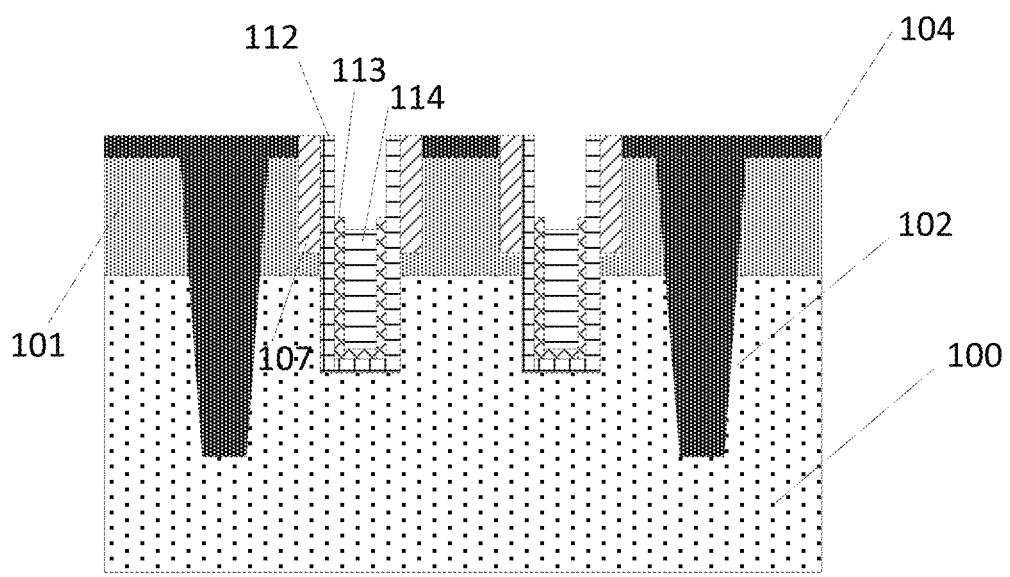
FIG. 12 is a schematic sectional diagram IX of a structure of a buried word line transistor provided by the present application.

Further, as shown in FIG. 12, the metal material layer 111, the barrier material layer 110, and the oxide material layer 109 on the upper surface of the substrate 100 are etched, and portion of the metal material layer 111 and portion of the barrier material layer 110 in the first trench 105 are etched to form a gate oxide layer 112, a barrier layer 113, and a metal filler layer 114.

Optionally, an upper surface of the metal filler layer 114 is higher than the bottom portion of the first trench 105. For example, a distance between the upper surface of the metal filler layer 114 and the upper surface of the substrate 100 is 40 to 80 nm, and a distance between the upper surface of the metal filler layer 114 and the bottom portion of the first trench 105 is 5 to 20 nm.

It should be noted that if portion of the metal material layer 111 and portion of the barrier material layer 110 in the second trench 108 are etched when the metal material layer 111 and the barrier material layer 110 are etched, the upper surface of the metal filler layer 114 is lower than the bottom portion of the first trench 105, which is not limited in the embodiment of the present application.

Optionally, the upper surface of the barrier layer 113 is higher than the upper surface of the metal filler layer 114, such that the barrier layer 113 has a better effect of blocking the metal diffusion of the metal filler layer 114. For example, a distance between the upper surface of the barrier layer 113 and the upper surface of the metal filler layer 114 is 3 to 20 nm.

It should be noted that when portion of the metal material layer 111 and portion of the barrier material layer 110 in the first trench 105 are etched to form the barrier layer 113 and the metal filler layer 114, after the metal material layer 111 and the barrier material layer 110 are etched to the same level, the metal material layer 111 continues to be etched. Or, the metal material layer 111 and the barrier material layer 110 can be etched to a required height respectively, and the order of etching of the metal material layer 111 and the barrier material layer 110 is not limited.

At S204, the first insulation layer is removed to form a side trench between the gate oxide layer and the side wall of the first trench.

Figure 13:
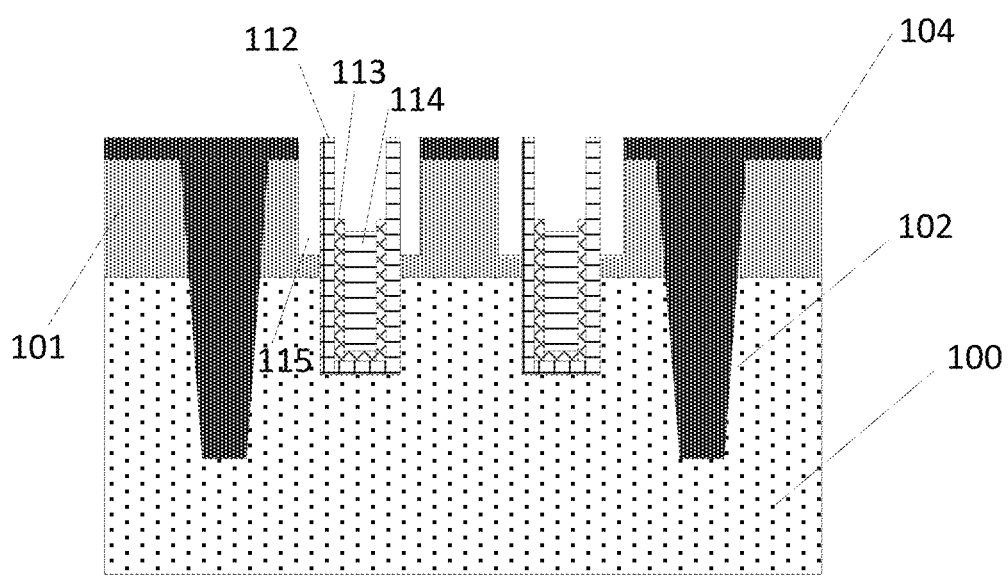
FIG. 13 is a schematic sectional diagram X of a structure of a buried word line transistor provided by the present application.

As shown in FIG. 13, in this step, the first insulation layer 107 can be removed by dry etching or wet etching, such that the side trench 115 is formed between the gate oxide layer 112 and the side wall of the first trench 105.

At S205, a second insulation layer is formed at a top end of the side trench and over the barrier layer and the metal filler layer, and therefore a sealed air spacer layer is formed between the gate oxide layer and the side wall of the first trench. An upper surface of the second insulation layer and an upper surface of the substrate are located on the same horizontal plane.

Figure 14:
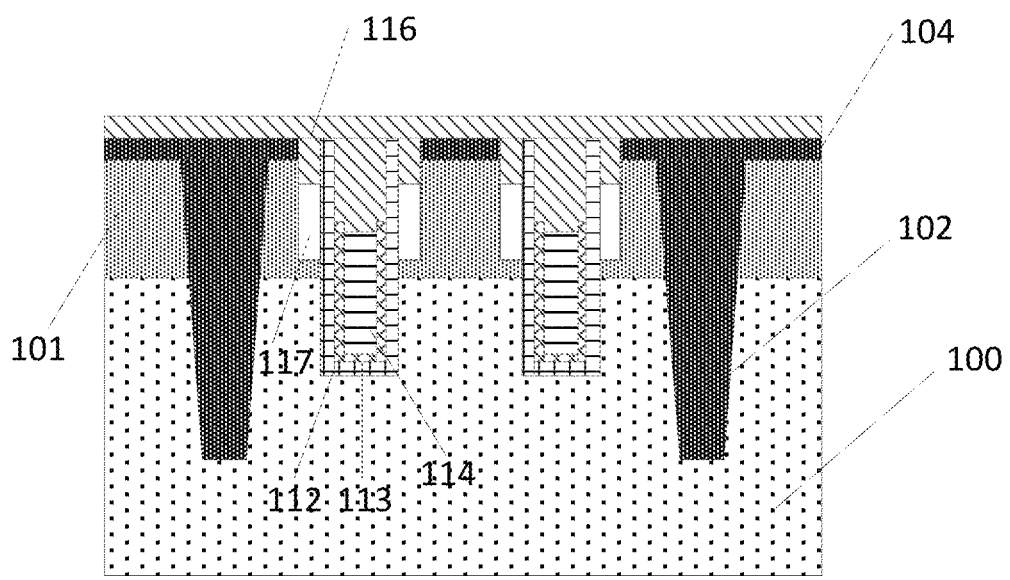
FIG. 14 is a schematic sectional diagram XI of a structure of a buried word line transistor provided by the present application.

As an example, this step is described with reference to FIG. 14 to FIG. 15. As shown in FIG. 14, the second insulation material layer 116 is formed at the top of the side trench 115, the inner side of the gate oxide layer 112 and the upper surface of the substrate 100 by using a chemical vapor deposition process. The second insulation material layer 116 at the top end of the side trench 115 forms the sealed air spacer layer 117 between the gate oxide layer 112 and the side wall of the first trench 105. Optionally, a material of the second insulation material layer 116 can be silicon nitride, silicon oxynitride, silicon dioxide, or the like. After the second insulation material layer 116 is formed by a chemical vapor deposition process, the chemical mechanical planarization method can be used for processing to planarize the surface of the second insulation material layer 116.

When the upper surface of the metal filler layer 114 is higher than the bottom portion of the first trench 105, the bottom portion of the air spacer layer 117 is lower than the upper surface of the metal filler layer 114. For example, a distance between the bottom portion of the air spacer layer 117 and the upper surface of the metal filler layer 114 is 5 to 20 nm. When the upper surface of the metal filler layer 114 is lower than the bottom portion of the first trench 105, the bottom portion of the air spacer layer 117 is lower than the upper surface of the metal filler layer 114, which is not limited in the present application.

It should be noted that when the bottom portion of the air spacer layer 117 is lower than the upper surface of the metal filler layer 114, an electric field generated by an overlap region between the metal filler layer 114 in a gate and the source/drain region can be better controlled, thus better improving the GIDL effect.

Figure 15:
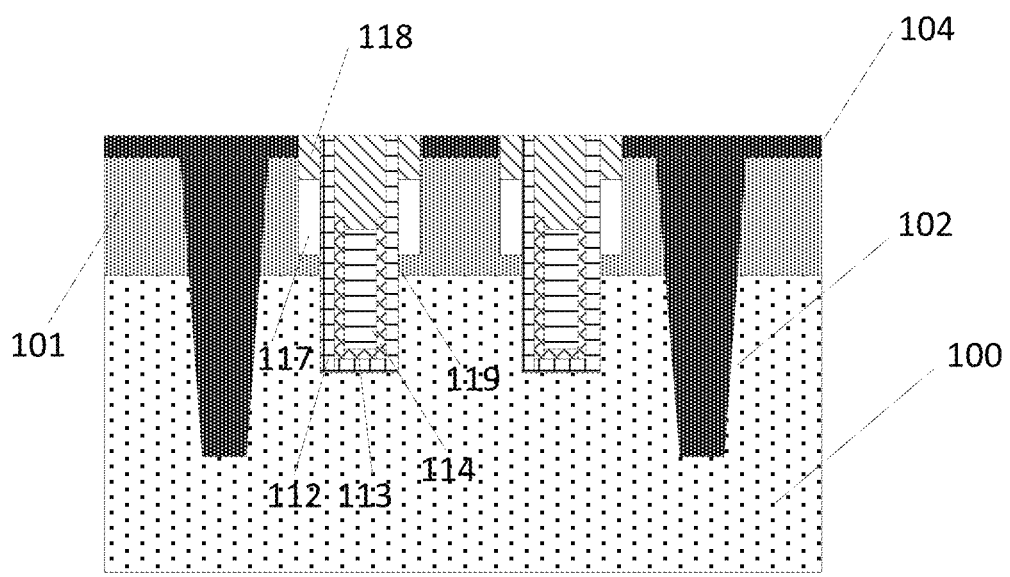
FIG. 15 is a schematic sectional diagram XII of a structure of a buried word line transistor provided by the present application.

Further, as shown in FIG. 14 to FIG. 15, the second insulation material layer 116 on the upper surface of the substrate 100 is etched to form a second insulation layer 118. The second insulation layer 118 is located over the air spacer layer 117 and over the barrier layer 113 and the metal filler layer 114. The barrier layer 113, the metal filler layer 114, the gate oxide layer 112, and the second insulation layer 118 over the barrier layer 113 and the metal filler layer 114 jointly constitute a buried word line.

The present application provides a method for manufacturing a buried word line transistor. In the method, an air spacer layer on a side wall of a buried word line is formed. Since air has a relatively low dielectric constant, a voltage between the gate and the source/drain region can be reduced, and the electric field strength of a PN junction is lowered, thereby reducing the GIDL and ensuring the performance and reliability of the transistor. In addition, by means of forming the barrier layer higher than the metal filler layer, metal diffusion can be more effectively prevented to avoid failure of the transistor.

The present application further provides a buried word line transistor. The buried word line transistor can be fabricated by the method in the above-mentioned embodiment, but is not limited to the method in the above-mentioned embodiment. Referring to FIG. 15, the buried word line transistor includes:

- a semiconductor substrate 100 including an active region 101;
- a word line trench 119 located in the active region 101;
- a gate oxide layer 112 located at a bottom portion and a side wall of the word line trench 119, an air spacer layer 117 being formed on an outer side wall of the gate oxide layer 112;
- a barrier layer 113 covering a bottom portion and portion of a side wall of the gate oxide layer 112;
- a metal filler layer 114 filling the bottom portion of the word line trench 119 and partially covering the surface of the barrier layer 113; and
- a second insulation layer 118 configured to seal the air spacer layer 117 and fill a space over the barrier layer 113 and the metal filler layer 114, an upper surface of the second insulation layer 118 and the upper surface of the substrate 100 being at the same horizontal plane.

Optionally, a bottom of the air spacer layer 117 is lower than an upper surface of the metal filler layer 114.

Optionally, a distance between the bottom of the air spacer layer 117 and the upper surface of the metal filler layer 114 is 5 to 20 nm.

Optionally, the upper surface of the barrier layer 113 is higher than the upper surface of the metal filler layer 114.

Optionally, a distance between the upper surface of the barrier layer 113 and the upper surface of the metal filler layer 114 is 3 to 20 nm.

Optionally, a depth of the air spacer layer 117 is 45 to 100 nm.

Optionally, a depth of the word line trench 119 is 120 to 200 nm, and a width is 15 to 50 nm.

As an example, a material of the gate oxide layer 112 can be silicon dioxide, silicon oxynitride, hafnium oxide, or the like, and a thickness can be 2 to 10 nm. A material of the barrier layer 113 can be titanium nitride, and a thickness can be 2 to 7 nm. The metal of the metal filler layer 114 can be tungsten. A material of the second insulation layer 118 can be silicon nitride, silicon oxynitride, silicon dioxide, or the like. The barrier layer 113, the metal filler layer 114, the gate oxide layer 112 and the second insulation layer 118 in the word line trench 119 jointly constitute a buried word line.

The present application provides a method for manufacturing a buried word line transistor. In the method, an air spacer layer on a side wall of the buried word line is formed. Since air has a relatively low dielectric constant, a voltage between the gate and the source/drain region can be reduced, and the electric field strength of a PN junction is lowered, thereby reducing the GIDL and ensuring the performance and reliability of the transistor. In addition, since the barrier layer is higher than the metal filler layer, metal diffusion of the metal filler layer can be more effectively prevented to avoid failure of the transistor.

The present application further provides a memory including the buried word line transistor in the above-mentioned embodiment.

It should be finally noted that the various above embodiments are only used to describe the technical solutions of the present application, and not intended to limit the present application. Although the present application has been described in detail with reference to the foregoing embodiments, those ordinarily skilled in the art should understand that they can still modify the technical solutions described in all the foregoing embodiments, or equivalently replace some or all of the technical features, and these modifications or replacements do not depart the essences of the corresponding technical solutions from the spirit and scope of the technical solutions of all the embodiments of the present application.

What is claimed is:

1. A method for manufacturing a buried word line transistor, comprising:
    providing a semiconductor substrate having an active region, forming a first trench in the active region;
    forming a first insulation layer on a side wall of the first trench, and etching a bottom portion of the first trench to form a second trench;
    forming a gate oxide layer on a side wall of the first insulation layer and a bottom portion and a side wall of the second trench, forming a barrier layer at a bottom portion and portion of a side wall of the gate oxide layer, and forming a metal filler layer on an inner side of the barrier layer;
    removing the first insulation layer to form a side trench between the gate oxide layer and the side wall of the first trench; and
    forming a second insulation layer at a top end of the side trench and over the barrier layer and the metal filler layer, and therefore forming a sealed air spacer layer between the gate oxide layer and the side wall of the first trench, an upper surface of the second insulation layer and an upper surface of the substrate being located on the same horizontal plane.

2. The method of claim 1, wherein the forming a first insulation layer on a side wall of the first trench, and etching a bottom portion of the first trench to form a second trench comprises:
    forming a first insulation material layer at a bottom portion and a side wall of the first trench and on an upper surface of the substrate by using an atomic layer deposition process;
    etching the first insulation material layer on the upper surface of the substrate and the first insulation material layer at the bottom portion of the first trench to form the first insulation layer; and
    etching the substrate exposed at the bottom portion of the first trench to form a second trench, wherein a width of the second trench is smaller than a width of the first trench.

3. The method of claim 1, wherein the forming a gate oxide layer on a side wall of the first insulation layer and a bottom portion and a side wall of the second trench, forming a barrier layer at a bottom portion and portion of a side wall of the gate oxide layer, and forming a metal filler layer on an inner side of the barrier layer comprises:

forming an oxide material layer on a surface of the first insulation layer, the bottom portion and the side wall of the second trench and an upper surface of the substrate by using a thin film deposition process;

forming a barrier material layer on a surface of the oxide material layer by using an atomic layer deposition process;

forming a metal material layer on a surface of the barrier material layer by using a chemical vapor deposition process, wherein the metal material layer fills the first trench and the second trench and covers the barrier material layer on the upper surface of the substrate; and etching the metal material layer, the barrier material layer, and the oxide material layer on the upper surface of the substrate, and etching portion of the metal material layer and portion of the barrier material layer in the first trench to form the gate oxide layer, the barrier layer, and the metal filler layer.

4. The method of claim 1, wherein the forming a second insulation layer at the top end of the side trench and over the barrier layer and the metal filler layer comprises:

forming a second insulation material layer at a top of the side trench, an inner side of the gate oxide layer, and an upper surface of the substrate by using a chemical vapor deposition process; and etching the second insulation material layer to form the second insulation layer.

5. The method of claim 1, wherein a bottom of the air spacer layer is lower than the upper surface of the metal filler layer.

6. The method of claim 5, wherein a distance between the bottom of the air spacer layer and the upper surface of the metal filler layer is 5 to 20 nm.

7. The method of claim 1, wherein an upper surface of the barrier layer is higher than an upper surface of the metal filler layer.

8. The method of claim 7, wherein a distance between the upper surface of the barrier layer and the upper surface of the metal filler layer is 3 to 20 nm.

9. The method of claim 1, wherein a depth of the first trench is 45 to 100 nm.

10. The method of claim 1, wherein the second trench has a depth of 50 to 130 nm, and a width of 15 to 50 nm.

11. A buried word line transistor, comprising:
a semiconductor substrate comprising an active region;
a word line trench located in the active region;
a gate oxide layer located at a bottom portion and a side wall of the word line trench, an air spacer layer being formed on an outer side wall of the gate oxide layer;
a barrier layer covering a bottom portion and portion of a side wall of the gate oxide layer;
a metal filler layer filling a bottom portion of the word line trench and partially covering a surface of the barrier layer; and
a second insulation layer configured to seal the air spacer layer and fill a space over the barrier layer and the metal filler layer, an upper surface of the second insulation layer and an upper surface of the substrate being located on the same horizontal plane.

12. The buried word line transistor of claim 11, wherein a bottom of the air spacer layer is lower than the upper surface of the metal filler layer.

13. The buried word line transistor of claim 11, wherein a distance between the bottom of the air spacer layer and the upper surface of the metal filler layer is 5 to 20 nm.

14. The buried word line transistor of claim 11, wherein an upper surface of the barrier layer is higher than the upper surface of the metal filler layer.

15. The buried word line transistor of claim 14, wherein a distance between the upper surface of the barrier layer and the upper surface of the metal filler layer is 3 to 20 nm.

16. The buried word line transistor of claim 11, wherein a depth of the air spacer layer is 45 to 100 nm.

17. The buried word line transistor of claim 11, wherein the word line trench has a depth of 120 to 200 nm, and a width of 15 to 50 nm.

18. A memory, comprising a buried word line transistor comprising:
a semiconductor substrate comprising an active region;
a word line trench located in the active region;
a gate oxide layer located at a bottom portion and a side wall of the word line trench, an air spacer layer being formed on an outer side wall of the gate oxide layer;
a barrier layer covering a bottom portion and portion of a side wall of the gate oxide layer;
a metal filler layer filling a bottom portion of the word line trench and partially covering a surface of the barrier layer;
a second insulation layer configured to seal the air spacer layer and fill a space over the barrier layer and the metal filler layer, an upper surface of the second insulation layer and an upper surface of the substrate being located on the same horizontal plane; and
the memory further comprising a shallow trench isolation structure formed in the semiconductor substrate.

19. The memory of claim 18, wherein a bottom of the air spacer layer is lower than the upper surface of the metal filler layer.

20. The memory of claim 18, wherein a distance between the bottom of the air spacer layer and the upper surface of the metal filler layer is 5 to 20 nm.

* * * * *